United States Patent [19]

Sato et al.

[11] Patent Number: 4,692,904

[45] Date of Patent: Sep. 8, 1987

[54] SEMICONDUCTOR INTEGRATED CIRCUIT DEVICE

[75] Inventors: Nobuyuki Sato, Tokorozawa; Kazuaki Ujiie, Tokyo; Masaaki Terasawa, Akishima; Shinji Nabetani, Tokyo, all of Japan

[73] Assignees: Hitachi, Ltd.; Hitachi Microcomputer Engineering, Ltd., both of Tokyo, Japan

[21] Appl. No.: 737,882

[22] Filed: May 28, 1985

[30] Foreign Application Priority Data

May 25, 1984 [JP] Japan .................................. 59-104629

[51] Int. Cl.$^4$ ............................................. G11C 7/00
[52] U.S. Cl. .................................... 365/226; 365/189
[58] Field of Search ............... 365/226, 228, 189, 218, 365/230, 233, 194, 195

[56] References Cited

PUBLICATIONS

"A 16-bit EEPROM whose access time is 350ns and whose power consumption is 300mW", Nikkei Electronics, July 6, 1981, pp. 193-206.

Primary Examiner—Joseph A. Popek
Attorney, Agent, or Firm—Antonelli, Terry & Wands

[57] ABSTRACT

A semiconductor integrated circuit device includes a semiconductor nonvolatile memory, a booster circuit which generates a high voltage required for writing the data into the semiconductor nonvolatile memory, and a control circuit. With the thus constructed device, however, various external control signals often fail to assume definite levels when the power source is closed. If an operation mode to be designated is erroneously determined to be a write operation mode due to obscure levels of the external control signals, then the write operation is executed erroneously. To prevent such an erroneous operation from developing when the power source is closed, provision is made of a power source closure detector circuit and a suitable gate circuit. Owing to these circuits, the output of the booster circuit is being applied to the memory element from the time from when the power source circuit is closed up to the times when the read operation mode is designated by an external control signal.

16 Claims, 7 Drawing Figures

SEMICONDUCTOR INTEGRATED CIRCUIT DEVICE

BACKGROUND OF THE INVENTION

The present invention relates to a semiconductor integrated circuit device, and particularly to an art that can be effectively utilized for a semiconductor integrated circuit device which includes a programmable ROM (read-only memory) onto which the data is written by a high voltage formed, for example, by an embedded booster circuit.

A semiconductor nonvolatile memory, such as an insulated gate field-effect transistor having a gate insulating film of double-layer construction consisting of a relatively thin silicon oxide film and a relatively thick silicon nitride film formed thereon (hereinafter such transistors will simply referred to as MNOS), holds the stored content even when a drive power source is broken. The MNOS is capable of electrically writing and erasing the stored data.

Under the erased condition or under the condition where the stored data has not been written, the threshold voltage of the MNOS takes a negative voltage such as −4 volts. To write or erase the stored data, an intense electric field is applied to the gate insulating film of the MNOS so that carriers are injected by the tunnel phenomenon.

In the writing operation, ground potential of the circuit, e.g., zero volt, is applied to the substrate gate of the MNOS, and a high voltage such as +25 volts is applied to the gate. A voltage of a level corresponding to the data to be written, such as a low voltage of nearly zero volt or a high voltage such as +20 volts is applied to the source region and drain region of the MNOS. As a high positive voltage is applied to the gate, a channel is induced in the surface of silicon region between the source region and the drain region. In this case, the potential of channel is the same as the potential of source region and drain region. Therefore, if a voltage of zero volt is applied to the source region and drain region as mentioned above, an intense electric field corresponding to the high voltage of the gate acts upon the gate insulating film. Accordingly, electrons as carriers are injected from the channel into the gate insulating film due to the tunnel phenomenon. Hence, the threshold voltage of MNOS changes from −4 volts mentioned above to a positive value such as +4 volts. On the other hand, if a voltage of +20 volts is applied to the source region and drain region as described above, a potential difference between the gate and the channel is as small as several volts. Namely, the gate insulating film is served with a voltage which is not sufficient to develop the tunnel phenomenon to inject electrons. Hence, the threshold voltage of MNOS does not change.

In erasing the data, a high voltage such as +25 volts is applied to the substrate gate while applying zero volt to the gate, to develop tunnel phenomenon in the reverse direction, so that electrons that serve as carriers are returned to the substrate gate. When such a memory element is used, the above-mentioned high voltage for writing must be supplied in addition to the power-source voltage that drives peripheral circuits such as address select circuits. Prior to accomplishing the present invention, therefore, the applicant has previously developed a semiconductor memory device which contains a booster circuit to form a high voltage for writing the data. It was, however, clarified by the inventors of the present invention that the problems arises as described below when a high voltage for writing is formed by the embedded booster circuit. That is, when the level of an external signal that designates the operation mode has not been determined at the time when the power source is closed or is started in the on state, the embedded booster circuit operates undesirably to form a high voltage for writing, presenting a probability of erroneous writing or erroneous erasing. To prevent the erroneous operation, it can be contrived to provide an external circuit which forms a control signal so that the program mode (writing mode) is not assumed. With such a method, however, the number of external parts increases, and the users will find it very inconvenient to use the device (as for the MNOS, reference should be made to, for example, Japanese Patent Laid-Open No. 156370/1980 (corresponding to U.S. Ser. No. 148,481 (abandoned) and divisional application of Ser. No. 487,085), journal "Nikkei Electronics, July 6, 1981, pp. 193–206).

SUMMARY OF THE INVENTION

An object of the present invention is to provide a semiconductor integrated circuit device which prevents erroneous operation from occurring when the power source is closed.

The above and other objects as well as novel features of the invention will become obvious from the description of the specification and the accompaying drawings.

A representative embodiment of the invention disclosed in the specification will be briefly mentioned below. Namely, a booster circuit which forms a high voltage to write or erase the data is caused to stop its operation and/or to stop the formation of the high voltage, and is released from such a condition, by using memory means which holds the stored data of one level when the power source is closed or started in the on state and which permits the stored data of another level to be written thereon responsive to a predetermined control signal from an external terminal.

DETAILED DESCRIPTION OF THE INVENTION

Figure 1:
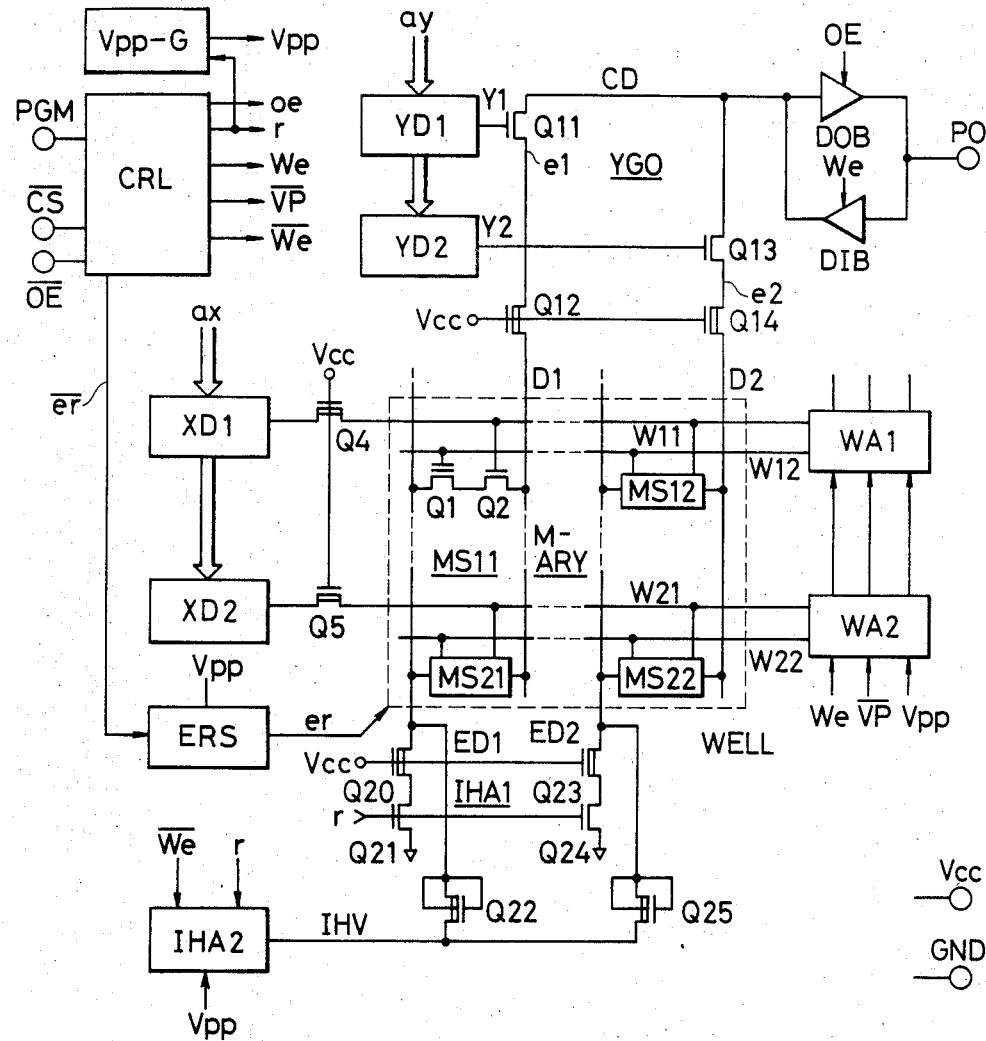
FIG. 1 is a circuit diagram illustrating an embodiment in which the present invention is utilized for a memory device that employs MNOS's as memory elements.

FIG. 1 is a circuit diagram of an embodiment in which the invention is adapted to a programmable ROM device which employs MNOS's as memory elements.

As will be described later in detail, the circuit of this embodiment includes circuits that form signals of a relatively low voltage such as X-decoders, Y-decoders, and control circuits and so on, and circuits that form signals of a relatively high voltage such as a writing circuit and an erasing circuit and so on along with a memory array.

Though not specifically limited, a low power-source voltage of +5 volts is supplied to a power source terminal Vcc of the circuits that form the low-voltage signals. Responsive thereto, the low-voltage signal has the high level of nearly +5 volts and has the low level of nearly zero volt which is ground potential of the circuit.

A high voltage Vpp which is used for the writing circuit and the erasing circuit, is formed by a high-voltage generator circuit Vpp-G comprised of a kind of voltage converter comprising of an oscillation circuit, a booster circuit and a control circuit as will be mentioned later. Responsive to the low power-source voltage supplied through the power source terminal Vcc, the high-voltage generator circuit Vpp-G produces an output of a voltage of as high as about +25 volts that is necessary to effect the writing operation and erasing operation of the circuit. Responsive to the high voltage Vpp, the high level of the high-voltage signal becomes nearly +25 volts or +20 volts, and the low level becomes nearly zero volt.

In FIG. 1, the memory array M-ARY includes memory cells MS11 to MS22 that are arranged in the form of a matrix. As represented by the memory cell MS11, each memory cell is constructed with a MOSFET Q2 for selecting address and an MNOS Q1 as concretely shown in FIG. 1.

Gates of address-selecting MOSFET's Q2 of memory cells MS11, MS12 arranged along the same row are commonly connected to a first word line W11, and gates of the MNOS's Q1 are commonly connected to a second word line W12. Similarly, gates of the address-selecting MOSFET's and MNOS's of memory cells MS21, MS22 arranged along another row, are also connected commonly to the first line W21 and to the second word line W22, respectively.

Drains of address-selecting MOSFET's Q2 of the memory cells MS11, MS21 arranged along the same column are commonly connected to a digit line or a data line D1, and sources of the MNOS's are commonly connected to a reference potential line ED1. Similarly, drains of address-selecting MOSFET's and sources of MNOS's of the memory cells MS12, MS22 arranged along another column, are commonly connected to a digit line D2 and to a reference potential line ED2, respectively.

Each of the circuits shown in FIG. 1 can be constituted using N-channel MOSFETs and some bipolar transistors. However, since most of the circuits shown in FIG. 1 do not have direct relation to the present invention, the detailed constructions of the circuits are not explained here. Most of the circuits shown in FIG. 1 can be constructed similarly to the circuits that are closely described in aforementioned Japanese Patent Laid-Open No. 156370/1980 filed by the applicant of the present application.

Upon receipt of a chip select signal, a program signal, and an output enable signal (hereinafter referred to as chip select signal $\overline{CS}$, program signal $\overline{PGM}$ and so on) supplied through external terminals $\overline{CS}$, $\overline{PGM}$, and $\overline{OE}$, the control circuit CRL forms internal control signals to control operation of the circuits of FIG. 1.

Though there is no particular limitation, when the chip select signal $\overline{CS}$ is of the high level and the program signal PGM is of the low level, then the combination of these signals represents a chip non-select mode.

When the chip-select signal $\overline{CS}$ and the output enable signal $\overline{OE}$ are of the low level and the program signal PGM is of the low level, then the combination thereof represents a read operation mode.

When the chip-select signal $\overline{CS}$ is of the high level and the program signal PGM is of the high level, then the combination thereof represents a write operation mode.

When the chip-select signal $\overline{CS}$ is of the low level and the program signal PGM is of the high level, then the combination thereof represents an erase operation mode.

In the read operation mode, an internal control signal $\overline{CS1}$ takes the low level. Responsive to the control signal $\overline{CS1}$ of the low level, a data output circuit DOB is rendered operative, and produces a signal corresponding to the input to a common external terminal PO.

An internal control signal r takes the low level in the write operation mode and in the erase operation mode. Responsive to the signal r of the low level, the high-voltage generator circuit Vpp-G is rendered to an operation enabling state.

In the write operation mode, internal control signals we and $\overline{we}$ become the high level and the low level, respectively. When the signal we is of the low level, a data input circuit DIB produces an output of a floating condition or of a high-impedance condition. When the signal we is of the high level, the data input circuit DIB produces to the output terminal thereof a signal which corresponds to a signal supplied to the common external terminal PO. A write inhibit circuit IHA2 produces a signal of nearly zero volt to a line IHV when the signal r is of the high level, and produces a high-voltage signal to the line IHV when the signals r and $\overline{we}$ are of the low level.

An internal control signal $\overline{vp}$ is rendered to the low level in the write operation mode. When the signal $\overline{vp}$ is of the high level, write circuits WA1 and WA2 cause the second word lines W12 and W22 to the low level which is close to zero volt irrespective of the levels of the first lines W11 and W21. When the signal $\overline{vp}$ is of the low level, the write circuits WA1 and WA2 produce to the second word lines W12 and W22 signals of the high voltage corresponding to the levels of the first word lines W11 and W21.

An internal control signal $\overline{er}$ is rendered to the low level in the erase operation mode. Responsive to the signal $\overline{er}$ of the low level, the erase circuit ERS produces a signal of the high voltage, i.e., produces a high-voltage signal to the line er.

The circuits shown in FIG. 1 are formed on a semiconductor substrate by a technique for producing semiconductor integrated circuits. The aforementioned Japanese Patent Laid-Open No. 156370/1980 further discloses in detail the technique for producing semiconductor integrated circuits of this kind and the construction thereof.

If mentioned briefly, the MOSFET's and MNOS's constituting the circuits of this embodiment are formed on the p-type well region formed on a semiconductor substrate that comprised of an n-type single crystalline silicon. According to this embodiment, the high voltage of positive polarity is applied to the MNOS that constitutes a memory cell and to the well region that serves as a substrate gate of an address-selecting MOSFET, in order to erase the data stored in the MNOS. In erasing the data, it is desired that the high voltage is not applied to the substrate gate of MOSFET's that constitute peripheral circuits such as X-decoders and Y-decoders, such that no limitation is imposed on the high voltage that is to be obtained and that the threshold voltage will not increase undesirably due to substrate bias effect that develops when the high voltage is applied to the substrate gate. According to this embodiment, therefore, the p-type well region WELL where the memory array is constituted is electrically isolated from the p-type well region where there are constituted peripheral circuits such as X-decoders and Y-decoders. That is, the p-type well region where the memory array is formed and the p-type well region where the peripheral circuits are formed, are formed independently of each other and are separated from each other.

To erase the data, it is possible that the individual memory cells may be formed in the independent well regions, or the memory cells arranged along the same row or the same column may be formed in a common well region. According to this embodiment, however, all of the memory cells constituting the memory array M-ARY are formed in a common well region WELL.

The first word lines W11, W21 are connected to output terminals of the X-decoders XD1, XD2 via MOSFET's Q4, Q5 of the depletion mode of which the gates are maintained at the power source voltage of 5 volts, and are served with select signals formed by the X-decoders XD1, XD2. The select signals take a high level of nearly 5 volts under the select condition and take a low level of nearly 0 volt under the non-select condition.

The second word lines W12, W22 are connected to output terminals of the write circuits WA1, WA2, respectively. The write circuits WA1, WA2 have input terminals coupled to the first word lines W11, W12, and have control input terminals coupled to the outputs we, vp of the control circuit CRL that will be described later.

The write circuits WA1, WA2 produce select output signals of the low level close to 0 volt during the operations other than the write operation. In the write operation, on the other hand, due to the high voltage Vpp, the signal levels of the second word lines W12, W22 are determined responsive to the signal levels of the first word lines W11, W21. For instance, the second word line W12 is driven to the high level of nearly +25 volts when the first word line W11 has the high level of nearly 5 volts as described above, and is driven to the low level of nearly zero volt when the first word line W11 has the low level. Similarly, the signal level of the other second word line W22 is determined depending upon the select level/non-select level of the corresponding first word line 21.

Each of reference potential lines ED1, ED2 of the memory array M-ARY is connected to the write inhibit circuit IHAI which includes unit switch circuits that are arranged between the reference potential lines and grounding points of the circuit. Every unit switch has the same construction. Though there is no particular limitation, each unit switch comprises of MOSFET's Q20 and Q21 that are connected in series between the reference potential line ED1 and ground terminal. The MOSFET Q21 in the unit switching circuit receives a control signal from the control circuit CRL via a control line r. In the operation for reading the stored data, the control signal r is driven to the high level of +5 volts to render the MOSFET Q21 on state. In the write operation and erase operation, the control signal r is driven to the low level of zero volt to render the MOSFET Q21 off state. Therefore, in the reading operation, the unit switching circuit operates such that the reference potential line ED1 takes nearly zero volt. The MOSFET Q20 is provided so that the unit switching circuit can withstand against high voltages. That is, the drain withstand voltage of MOSFET such as MOSFET Q21 is affected by the gate potential, and decreases with the decrease in the gate potential. Decrease in the drain withstand voltage stems from the fact that the depletion layer that stretches from the drain junction in the vicinity of gate electrode, is restricted by the electric field established by the gate electrode. The MOSFET Q20 restricts the voltage applied to the drain of MOSFET Q21 when it is rendered nonconductive. The MOSFET Q20 itself has a high drain without voltage, since its gate is maintained to the level of power source voltage Vcc. Therefore, the unit switching circuit comprising of MOSFET's Q20 and Q21 exhibits a high withstand voltage. This eliminates the probability that the unit switching circuit restricts the leve of high voltage applied to the reference potential line ED1.

A MOSFET Q22 is connected between the reference potential line ED1 and the high-voltage signal line IHV. The high-voltage signal line IHV receives from a write inhibit voltage generator circuit IHA2 a signal which takes the high level of about +20 volts in the write operation and in the erase operation, and which takes nearly zero volt in the read operation. In the write operation and erase operation, when the MOSFET Q21 of the unit switching circuit is rendered to the off state, a high voltage is applied from the high-voltage signal line IHV to the reference potential line ED1 via MOSFET Q22. This also holds for the unit switching circuit provided for the other reference potential line ED2.

A Y-gate circuit YGO is provided between a common digit line CD and digit lines D1, D2 of the memory array M-ARY. In the Y-gate circuit YGO, a unit gate circuit is constituted by MOSFET's Q11, Q12 that are connected in series between the digit line D1 and the common digit line CD. Responsive to the output of the Y-decoder YD1, the unit gate circuit couples the digit line D1 to the common digit line CD. Similarly, MOSFET's Q13, Q14 constitutes another unit gate circuit which works to couple the digit line D2 to the common digit line CD responsive to the output of the Y-decoder YD2.

A high-voltage signal is applied to the digit lines D1, D2 during the erase operation. Therefore, the unit gate circuits must have a high withstand voltage. In order to increase the withstand voltage, the unit gate circuits are provided with depletion-type MOSFET's Q12, Q14 that receive through the gates thereof the power source voltage Vcc at all times. The MOSFET's Q12, Q14 have a high junction withstand voltage because of the same reasons as described with reference to the MOSFET Q20. Owing to the MOSFET's Q12, Q14, a voltage applied to the electrodes e1, e2 of MOSFET's Q11, Q13 is limited to a relatively small value even when a high voltage is applied to the digit lines D1, D2. Accordingly, the MOSFET's Q11, Q13 are prevented from being broken down. Select operation of the Y-decoders YD1, YD2 is the same as that of the X-decoders XD1, XD2.

To the common digit line CD, there are connected an input terminal of the data output circuit DOB which includes a sense circuit and an output terminal of the data input circuit DIB. Though there is no particular limitation, the output of the data output circuit DOB and the input of the data input circuit DIB are connected to a common input/output terminal PO.

Upon receipt of a signal from the control circuit CRL, an eraser circuit ERS applies the high voltage of nearly +25 volts to the well region WELL of memory array M-ARY during the erase operation and applies the voltage of nearly zero volt to the well region WELL during the write operation and the read operation.

Figure 2:
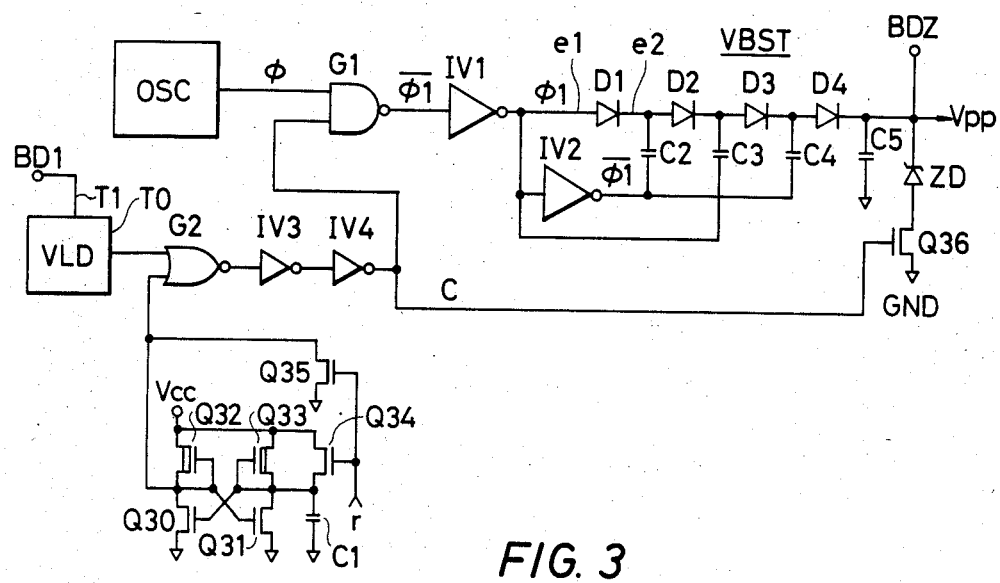
FIG. 2 is a circuit diagram showing a high-voltage generator circuit according to the embodiment.

In order to prevent the occurrence of erroneous writing or erasing when the power source is closed according to this embodiment, the high-voltage generator circuit Vpp-G includes a control circuit as shown in FIG. 2.

In the same figure, OSC denotes an oscillation circuit, G1 denotes a NAND gate circuit, G2 denotes a NOR gate circuit, IV1 to IV4 denote inverter circuits, and VDS denotes a voltage discriminator circuit. These circuits are served with the power source voltage Vcc.

Though there is no particular limitation, it should be considered that when the power source voltage Vcc is closed or started on state, the oscillation circuit OSC produces pulse signals $\phi$ of which the level periodically changes into almost zero volt and almost Vcc. Other circuits in FIG. 2 produce output signals of the low level close to zero volt or of the high level close to Vcc depending upon those input conditions.

Figure 3:
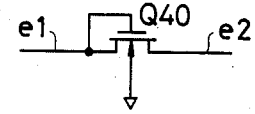
FIGS. 3 to 5 are circuit diagrams showing rectifier circuits.

The pulse signal $\phi$ produced by the oscillation circuit OSC is supplied to the NAND gate G1. A pulse signal $\bar{\phi}$ produced by the NAND gate G1 is supplied to a driving inverter circuit IV1 which produces a noninverted pulse signal $\phi 1$ from an output terminal thereof. Upon receipt of the pulse signal $\phi 1$, a driving inverter circuit IV2 produces an inverted pulse signal $\bar{\phi}$ from an output terminal thereof. Complementary pulse signals $\phi$, $\bar{\phi}$ formed by the circuits IV1, IV2 are supplied to a booster circuit VBST. In FIG. 2, the booster circuit VBST is illustrated to be made up of a ladder-like circuit comprising of diodes D1 to D4 and capacitors C2 to C5, to simplify the diagram. It should, however, be comprehended that each of the diodes D1 to D4 of the embodiment constituted in the form of a MOS integrated circuit, comprises of a diode-connected MOSFET as shown in FIG. 3. Similarly, it should be considered that each of the capacitors C2 to C4 is comprised of a MOS capacitor. The electrode of each capacitor corresponding to the gate electrode of MOSFET is coupled to a common connection point of diodes, and the electrode of each capacitor corresponding to the drain or source of MOSFET is coupled to the output terminal of the inverter circuit IV1 or IV2. It should be considered that the capacitor C5 is comprised of MOS capacity as well as parasitic capacity in the MOSFET that constitutes the circuit of FIG. 1, wiring capacity, and junction capacities between various well regions and the semiconductor substrate.

Figure 4:
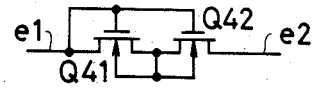
Figure 5:
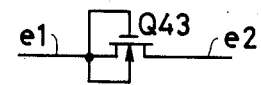

Electrodes e1, e2 of the MOSFET of FIG. 3 correspond with the anode e1 and cathode e2 of the diode of FIG. 2, respectively. The MOSFET of FIG. 3 is rendered to on state when the potential at the electrode e1 becomes a positive value that is greater by the threshold voltage thereof than the potential at the electrode e2. In the MOSFET of FIG. 3, the substrate gate is maintained at ground potential of the circuit and, hence, the threshold voltage changes depending upon the substrate bias effect. Namely, the threshold voltage of the MOSFET increases with the increase in the voltage level that is to be switched. Increase in the threshold voltage means increase in the voltage loss. As requied, therefore, each of the diodes of FIG. 2 may be constituted by MOSFET's that are connected as shown in FIG. 4 or FIG. 5, so that the threshold voltage will not increase.

In the booster circuit VBST, the non-inverted timing signal $\phi$ formed by the inverter circuit IV1 is supplied to one electrode of the capacitor C2 via diode D1. To the other electrode of the capacitor C2 is supplied the inverted timing signal $\bar{\phi}$ formed by the inverter circuit IV2. One electrode of the capacitor C2 is connected to one electrode of the capacitor C3 via diode D2. To the other electrode of the capacitor C3 is upplied the non-inverted timing signal $\phi$ formed by the inverter circuit IV1.

Further, one electorde of the capacitor C3 is connected to one electrode of the capacitor C4 via diode D3. To the other electrode of the capacitor C4 is supplied the inverted timing signal $\bar{\phi}$ formed by the inverter IV2.

One electrode of the capacitor C4 is connected to one electrode of the capacitor C5 via diode D4. The other electrode of the capacitor C5 is connected to a point of ground potential of the circuit.

Operation of the booster circuit of this embodiment will be described below briefly. When the non-inverted timing signal $\phi$ is of the high level, the inverted timing signal $\bar{\phi}$ becomes the low level. Owing to the high level, therefore, the capacitor C2 is electrically charged via diode D1. Next, during a period in which the non-inverted timing signal $\phi$ is of the low level and the inverted timing signal $\bar{\phi}$ is of the high level, the other electrode of the capacitor C2 becomes the high level. Owing to the bootstrap function, therefore, a voltage which is boosted to a high level which is about twice the voltage Vcc appears on one electrode of the capacitor C2. The boosted voltage is supplied to one electrode of the capacitor C3 via diode D2. In this case, the capacitor C3 is electrically charged by the boosted voltage since the other electrode thereof is assuming the low level upon receipt of the non-inverted timing signal $\phi$.

Then, as the non-inverted timing signal $\phi$ becomes the high level and the inverted timing signal $\bar{\phi}$ becomes the low level again, the capacitor C2 is electrically charged again. At the same time, responsive to the high level appearing at the other electrode of the capacitor C3, a bootstrap voltage which is based upon the above high level and the level built up by the charging operation, appears on one electrode of the capacitor C3. The bootstrap voltage is supplied to the capacitor C4 via diode D3.

Then, as the non-inverted timing signal $\phi$ becomes the low level and the inverted timing signal $\bar{\phi}$ becomes the high level, the capacitor C3 is electrically charged. At the same time, the other electrode of the capacitor C4 is changed to the high level. Therefore, the bootstrap voltage based upon the high level and the level built up by the charging operation, appears on one electrode of the capacitor C4. Accordingly, the capacitor C5 is electrically charged via diode D4.

The above-mentioned operation is repeated, and the capacitor C5 finally gains a high voltage Vpp which is boosted to as high as about five times the level of power source voltage Vcc. Strictly speaking, the level is lost by an amount equal to forward voltage through the diodes D1 to D4.

According to this embodiment, though there is no particular limitation, a constant-voltage diode ZD is provided in parallel with the output capacitor C5 in order to stabilize the high voltage Vpp to a desired level. A MOSFET Q36 is provided between the constant-voltage diode ZD and a ground point of the circuit. A constant voltage operation by the constant-voltage diode ZD becomes effective when the MOSFET Q36 is rendered to on state. In order to efficiently write the data onto the MNOS, the level stabilized by the constant-voltage diode ZD is brought as close as possible to the junction withstand voltage of MNOS but so as not to exceed the junction withstand voltage.

Figure 6:
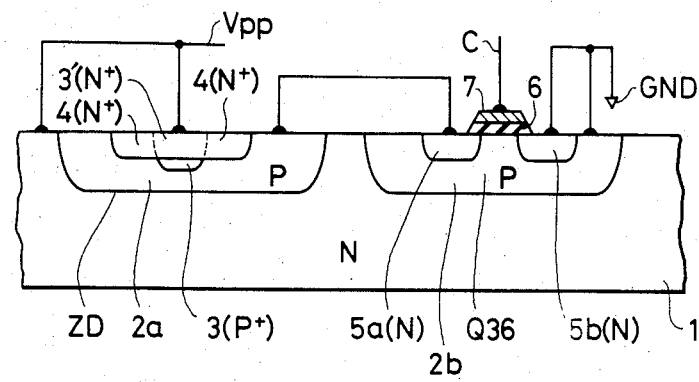
FIG. 6 is a section view of a semiconductor substrate.

FIG. 6 is a section view illustrating the structure of constant-voltage diode ZD together with the MOSFET Q36. The constant-voltage diode ZD comprises of a p-type well region 2a formed in the surface of an n-type semiconductor substrate 1, an n-type semiconductor region 4 formed in the surface of the p-type well region 2a, and a p+-type semiconductor region 3 having a relatively high impurity concentration. The MOSFET Q36 comprises of n-type semiconductor regions 5a, 5b that work as drain and source regions being formed in the surface of the p-type well region 2b, and an n-type polycrystalline silicon layer 7 that serves as a gate electrode and that is formed, via a gate insulating film 6, on the surface of the p-type well region 2b of a portion sandwitched between the semiconductor regions 5a and 5b. Except for the active regions where there will be formed elements and semiconductor wirings, the surface of the semiconductor substrate 1 is covered with a field insulating film having a relatively large thickness, though it is not diagrammed. To the constant-voltage diode ZD and MOSFET Q36 are coupled a wiring layer comprising of a vaporized aluminum layer and so on that elongates on such a field insulating film.

The p-type well region 2a and the n-type semiconductor region 4 are formed simultaneously with the formation of p-type well regions for forming MOSFET and MNOS and source and drain regions, by the technique for producing semiconductor integrated circuit devices, and are allowed to have conductivity-determining impurities maintaining the same concentration distributions as those of these regions. Since the n-type semiconductor region 4 and the p-type semiconductor region 3 of a high impurity concentration are close to each other, the the level of constant voltage of the constant-voltage diode ZD is slightly lower than the level of a drain-source junction breakdown voltage of MOSFET and MNOS.

According to this embodiment, provision is made of the below-mentioned circuits in order to prevent erroneous writing or erroneous erasing from occurring when the power source circuit is closed and to facilitate performance test.

In FIG. 2, in order to invalidate the output of the booster circuit VBST in testing the integrated circuit device, there is disposed a voltage detector circuit VLD which has an input terminal T1 coupled to a pad electrode BP1 and an output terminal T0 coupled to one input terminal of the NOR gate circuit G2. The voltage detector circuit VLD produces a signal of a high level of nearly 5 volts when a voltage greater than a predetermined level is applied to the pad eletrode BD1, and produces a signal of a low level of nearly zero volt when the pad electrode BD1 is floating or is assuming a level lower than a predetermined level. Though there is no particular limitation, the detection level of the voltage detector circuit VLD should be higher than the power source voltage Vcc and should desirably be nearly the same as the level obtained by the booster circuit VBST. This makes it possible to sufficiently prevent the voltage detector circuit VLD from erroneously operating even when undesired potential change that is regarded as noise is applied to the pad electrode BD1 via undesired coupling capacities between the pad electrode BD1 and the wirings.

Though there is no particular limitation, the voltage detector circuit VLD may be comprised of a flip-flop circuit that is constituted by coupling, in a crossing manner, the inputs and outputs of a MOS inverter circuit having a high logic threshold voltage and a MOS inverter circuit having a low logic threshold voltage within a range of power source voltage Vcc, and a MOS inverter circuit which works as a waveform shaping circuit or a buffer circuit to receive output of the flip-flop circuit. In this case, the pad electrode BD1 is coupled to an input terminal of the MOS inverter circuit which has the high logic threshold voltage. Being constructed as described above, the high logic threshold voltage can be regarded as the voltage detection level. When a voltage of a level in excess of the high logic threshold voltage is applied to the pad electrode BD1, the voltage detector circuit VLD produces a signal of the high level of nearly the power source voltage Vcc. The flip-flop circuit is comprised of two asymmetrical inverter circuits and, hence, assumes one stable condition when the pad electrode BD1 is under the floating condition. Responsive thereto, the voltage detector circuit VLD produces a signal of the low level of nearly zero volt.

Though there is no particular limitation, the pad electrode BD1 is constructed in the same manner as the bonding pad that serves as an external terminal of the integrated circuit device of FIG. 1, and is formed on the semiconductor substrate. However, the pad electrode BD1 is exclusively formed for the purpose of testing. When the device is completed, i.e., sealed, therefore, the pad electrode BD1 does not need be used as the external terminal of the integrated circuit device anymore. A desired voltage is applied via a probe needle composed of tungsten or the like to the pad electrode BD1 under the condition where various pad electrodes formed on the semiconductor substrate are exposed like when the semiconductor wafer is being tested.

In FIG. 2, a flip-flop circuit FF works as a power source closure detector circuit. The flip-flop circuit FF includes a pair of inverter circuits constituted by drive means comprised of enhancement-type MOSFET's Q30, Q31, and load means comprised of depletion-type MOSFET's Q32, Q33. Input terminals and output terminals of the pair of inverter circuits are coupled to each other in a crossing manner. A capacitor C1 is provided between the drain of MOSFET Q31 that serves as an input/output terminal of the flip-flop circuit and a point of ground potential of the circuit. MOSFET's Q34, Q35 for inverted writing or for inverting the condition are provided between one input/output terminal of the flip-flop circuit FF and the power source Vcc, and between the other input/output terminal and a ground point of the circuit. These MOSFET's Q34, Q35 receive the control signal r through the gates thereof.

Though there is no particular limitation, the pair of inverter circuits constituting the flip-flop circuits FF have the same input/output characteristics.

When the power source voltage is applied, the flip-flop circuit FF of FIG. 2 establishes the stable condition as described below.

That is, as the power source voltage Vcc is applied, gates of the MOSFET's Q30, Q31 are electrically charged via load MOSFET's Q33, Q32. In this case, the rate of electrically charging to the gate of MOSFET Q30 is lowered by the capacitor C1 when the power source is closed. When the power source is closed, therefore, the MOSFET Q30 is rendered to off state and the MOSFET Q31 is rendered to on state stably in the flip-flop circuit FF.

A signal (drain output of MOSFET Q30) stabilized to the high-level side of flip-flop circuit FF, is supplied to the NOR gate circuit G2. Though not specifically limited, a signal of the NOR gate circuit G2 is supplied to inverter circuits IV3, IV4 that are connected in cascade to form a kind of buffer circuit. Being constructed as mentioned above, the inverter circuit IV4 produces through an output terminal thereof a control signal C that corresponds to the output of the NOR gate circuit. The control signal C produced from the output terminal of the inverter circuit IV4 is supplied to the NAND gate G1 provided on the output side of the oscillation circuit OSC, and is further supplied to the gate of MOSFET Q36 that is connected in series with the Zener diode ZD.

With the power source being closed, if an unstable level of the control signal supplied to the external terminal of FIG. 1 is erroneously discriminated by the control circuit CRL to be a level that designates the write mode or the erase mode, there is produced the internal control signal r of the low level responsive thereto. Erroneous write mode or erroneous erase mode causes the write inhibit voltage generator circuits IHA2, IHA1 of FIG. 1 to stop the write inhibit operation, or causes the erase circuit ERS to operate. If the flip-flop circuit FF of FIG. 2 has not been provided, a high voltage is produced by the booster circuit VBST and is applied to the memory array M-ARY via the write inhibit voltage generator circuits IHA2, IHA1 or the erasing circuit ERS, resulting in erroneous writing or erroneous erasing.

According to this embodiment, however, the flip-flop circuit helps prevent the occurrence of erroneous writing or erroneous erasing.

That is, the control signal C takes the low level at starting the power source since the output of the flip-flop circuit FF automatically becomes the high level responsive to the starting of power source. Operation of the booster circuit VBST is invalidated by the control signal C of the low level; i.e., the booster circuit VBST does not produce a high voltage. Accordingly, erroneous writing or erroneous erasing does not occur.

With the power source being closed, if an unstable level of the control signal supplied from the external unit is discriminated by the control circuit CRL to be a level that designates a mode other than the write operation mode and the erase operation mode, there is produced the internal control signal r of the high level. The control signal r of the high level renders the MOSFET's Q34, Q35 to on state, so that the flip-flop circuit FF produces a signal of the low level. Responsive thereto, the control signal C becomes the high level, whereby the NAND gate G1 is opened, and a timing signal $\phi$ formed by the oscillation circuit OSC is supplied to the booster circuit. In this case, therefore, the aforementioned voltage boostering operation is effected as the power source is closed, and the high voltage Vpp is formed. Responsive to the control signal C of the high level, furthermore, the MOSFET Q36 is rendered conductive, and the high voltage Vpp is stabilized by the constant-voltage diode ZD.

In this case, however, since the mode is not the write operation mode or the erase operation mode, even the formation of the high voltage Vpp does not give rise to the occurrence of erroneous writing or erroneous erasing.

When the power source is closed, the ordinary write operation or the erase operation is effected after an external control signal is so controlled that the control signal r once becomes the high level.

In a test such as semiconductor wafer testing, a probe needle such as a tungsten needle is brought into contact with the pad electrode BD2 that is coupled to the output of the booster circuit VBST, and the output level of the booster circuit VBST is checked via the probe needle.

In a test such as voltage margin testing, a high voltage is supplied to the pad electrode BD1 via the probe needle, whereby operation of the booster circuit VBST is invalidated. Further, the MOSFET Q36 connected in series with the constant-voltage diode is rendered to off state. In this case, an external voltage of a suitable level has been supplied via probe needle to the pad electrode BD2 that is coupled to the output of the booster circuit VBST. This makes it possible to inspect operation margins of various circuits shown in FIG. 1. The MOSFET Q36 is provided so that such testings can be performed. If the MOSFET Q36 is rendered to off state, the operation of the constant-voltage diode ZD is invalidated. This makes it possible to apply a voltage of a level in excess of the constant-voltage level of constant-voltage diode ZD to the pad electrode BD2.

According to the present invention, the effects are obtained as described below.

(1) Using memory means which stores the data of one level when the power source is closed, operation of the booster circuit is substantially stopped or, in other words, production of the boosted voltage is halted, in order to substantially inhibit the write operation or the erase operation even under the condition where the external control signal designates the write operation mode or the erase operation mode when the power source is closed. Therefore, erroneous writing or erroneous erasing is prevented from occurring without the need of providing any external or additional circuit.

(2) Because of the reasons mentioned in (1) above, the user does not have to provide any additional circuit for closing the power source, and does not have to give any attention in regard to the level of control signal. Therefore, the user finds it very easy to handle the semiconductor integrated circuit device having a memory circuit.

(3) Use is made of a flip-flop circuit which stabilizes to one level when the power source is closed, as memory means to stop the operation of the internal booster circuit and to liberate it from the stopped condition. Namely, the flip-flop circuit is contained very easily in the semiconductor integrated circuit, so that the booster circuit can be easily liberated from the stopped condition.

In the foregoing was concretely described the invention accomplished by the inventors by way of an embodiment. However, the invention should in no way be limited to the above-mentioned embodiment only, but can be modified in a variety of other ways without departing from the spirit and scope of the invention. For instance, the memory circuit may employ, as a memory element, a FAMOS (floating gate avalanche injection MOS) whch has a control gate and a floating gate. Even the memory circuit employing FAMOS as a memory element makes it possible to write the data relying upon a relatively high voltage. When a high-voltage generator circuit for writing is contained, therefore, there exists probability that the data may be erroneously written when a power source is closed. Further, the above-mentioned memory circuit may be a memory device (NVSRAM) which is composed of a combination of electrically rewritable and erasable memory elements such as MNOS, MONOS (having three gate insulating films, i.e., a relatively thin silicon oxide film, a relatively thick silicon nitride film, and a relatively thick silicon oxide film), FLOTOX (floating gate tunnel oxide), and the like, and static memory cells, and in which data stored in the static memory cells are written onto the memory elements prior to interrupting the power source, and the data stored in the memory elements are written onto the static memory cells when the power source is closed again.

Further, when a flip-flop circuit is used as memory means to form a control signal in order to subsaantially stop the voltage boosting operation just after the power source is closed, the element characteristics should be selected asymmetrically so that the operation is stabilized to either one of the levels.

When the NAND gate G1 is provided as shown in FIG. 2, the oscillation operation can be stabilized in advance irrespective of the starting characteristics of the oscillation circuit OSC. Therefore, stable oscillation signals can be supplied to the booster circuit VBST when the boosting operation is resumed. However, when there arises no problem even when the starting characteristics of the oscillation circuit OSC are neglected, then a MOSFET that works as a power switch being controlled by a control signal C can be provided on the side of power source terminal of the oscillation circuit OSC or on the side of ground terminal, so that output of the oscillation circuit OSC is directly supplied to the booster circuit VBST.

Figure 7:
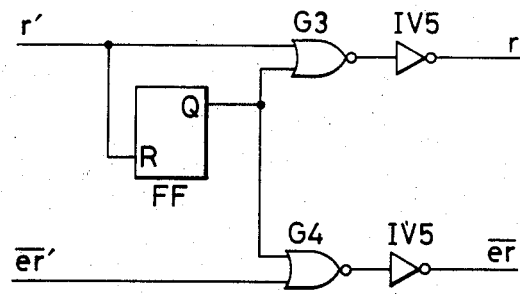
FIG. 7 is a circuit diagram showing another embodiment.

When there arises no problem even when an internal control signal is produced from the control circuit CRL of FIG. 1 at a timing that is slightly delayed, then a flip-flop circuit which is the same as the flip-flop circuit FF of FIG. 2 may be provided on the control circuit CRL, such that the internal control signals r, $\overline{er}$ and the like are forced to assume predetermined levels depending upon the output of the flip-flop circuit. FIG. 7 shows a circuit which causes the control signals r, $\overline{er}$ to assume predetermined levels when the power source is closed, wherein FF denotes a flip-flop circuit constructed in the same manner as the flip-flop circuit which comprises of MOSFET's Q30 to Q35 and a capacitor C1 of FIG. 2. When the power source is closed, the flip-flop circuit FF produces an output Q of the high level. Under this condition, the output control signals r and $\overline{er}$ are forced to assume the high level irrespective of the control signals r' and $\overline{er}'$ that are formed based upon the external control signal. That is, the signals r, $\overline{er}$ supplied to the write inhibit voltage generator circuits IHA2, IHA1, and erasing circuit ERS of FIG. 1, assume a level that designates the non-write mode or the non-erase mode. Therefore, erroneous writing or erroneous erasing is prevented from occurring. The flip-flop circuit of FIG. 7 is reset when the control signal r' assumes the high level responsive to a definite level of the external control signal. After the flip-clop circuit FF has been reset, the signals r, $\overline{er}$ produced by the control circuit CRL become substantially the same as the signals r', $\overline{er}'$. When the control circuit CRL is provided with a circuit of FIG. 7, there is no need of providing the circuit of FIG. 2. In this case, the booster circuit VBST does not stop its operation.

The booster circuit can be formed in a variety of other forms such as the one that utilizes timing signals of two phases. In addition to stopping the operation of the booster circuit, the high voltage may be inhibited from being sent to the writing circuit or to the erasing circuit by the control signal, while the booster circuit continues its operation.

The present invention can be extensively utilized for semiconductor integrated circuit devices that contain memory circuit which effects the writing or erasing relying upon a high voltage, and a high-voltage generator circuit that is necessary for operating the memory circuit. Namely, the invention can be extensively utilized for a variety of semiconductor integrated circuit devices that contain a memory device as in the above-mentioned embodiment, as well as memory circuit such as a microcomputer.

What is claimed is:

1. A semiconductor integrated circuit device comprising:

a memory circuit which includes a memory element for storing data, wherein a voltage equal to greater than a predetermined level is required to be applied to said memory element to change the state of data stored in said memory element;

a voltage converter circuit which receives a power source voltage supplied from a power source through an external terminal as its power source voltage, and which forms an output voltage of a level different from that of said power source voltage, said output voltage being equal to or greater than the predetermined voltage level required to change the state of data stored in said memory element;

means for receiving an external control signal indicative of when data stored in said memory element is to be changed, and for generating a control signal on a control line which control signal changes from a first level to a second level when the external control signal indicates that the stored data of said memory element is to be changed;

a power source closure detector circuit coupled to said control line and to said power source which power source closure detector circuit assumes a first condition when the power source is closed and which assumes a second condition when the control signal having the first level is produced; and a control circuit coupled to said power source closure detector circuit, said control circuit including means for preventing the output voltage of said voltage converter circuit from being applied to said memory element during a period in which the power source closure detector circuit is assuming the first condition.

2. A semiconductor integrated circuit device according to claim 1, wherein said memory circuit is comprised of a semiconductor nonvolatile memory.

3. A semiconductor integrated circuit device according to claim 2, wherein said memory element includes a FAMOS.

4. A semiconductor integrated circuit device according to claim 2, wherein said memory element is constructed so that data can be electrically erased or data can be electrically written.

5. A semiconductor integrated circuit device according to claim 2, wherein said power source closure detector circuit comprises a flip-flop circuit coupled to said power source and to said control line, wherein said flip-flop circuit assumes a first condition when the power source circuit is closed and assumes a second condition responsive to said control signal.

6. A semiconductor integrated circuit device according to claim 5, wherein said flip-flop circuit is comprised of a pair of MOSFET's of which the gates and drains are coupled in a crossing manner, a pair of load elements which, when the power source is closed, applies potential changes of dissimilarly rising rates to the drain of said pair of MOSFET's, and a control MOSFET of which the switching operation is controlled by a control signal.

7. A semiconductor integrated circuit device according to claim 2, wherein said voltage converter circuit is comprised of a booster circuit which, upon receipt of periodic pulse signals, produces a voltage of a level greater than the level of said power source voltage, and said control circuit comprises of a gate circuit which controls said pulse signals that are supplied to said voltage converter circuit.

8. A semiconductor integrated circuit device according to claim 7, wherein said voltage converter circuit is comprised of a constant-voltage element which restricts the level of output voltage thereof.

9. A semiconductor integrated circuit according to claim 8, further comprising a switching element which prevents the voltage-control function of said constant-voltage element during a period in which the operation of said voltage converter circuit is stopped, and a terminal which is coupled to an output terminal of said voltage converter circuit and which receives a voltage from an external unit.

10. A semiconductor integrated circuit according to claim 7, further comprising an oscillation circuit which forms said periodic pulse signals that will be supplied to said control circuit.

11. A semiconductor integrated circuit device comprising:
a semiconductor nonvolatile memory element for storing data, wherein a voltage equal to greater than a predetermined level is required to be applied to said memory element to change the state of data stored in said memory element;
a booster circuit coupled to receive a power source voltage from a power source, said booster circuit including means for generating an output voltage of a level greater than that of said power source voltage of the circuit upon receipt of periodic pulse signals, said output voltage being equal to or greater than the predetermined voltage level required to change the state of data stored in the memory element;
means for receiving external control signals indicative of when data stored in said memory element is to be changed, and for generating a control signal on a control line which control signal assumes a first level when said external control signals indicate that the data stored in said semiconductor nonvolatile memory is to be read out, and assumes a second level when said external control signals indicate that the stored data is to be written into said semiconductor nonvolatile memory; and
a control circuit coupled to receive said power source voltage and coupled to said control line, said control circuit including means for preventing the output voltage of said booster circuit from being applied to said memory element during a period from when the power source is closed up to when said control signal assumes said first level.

12. A semiconductor integrated circuit device according to claim 11, wherein said control circuit is comprised of a gate circuit which controls said periodic pulse signals supplied to said booster circuit.

13. A semiconductor integrated circuit device comprising:
a memory circuit which includes a memory element for storing data, wherein a voltage equal to greater than a predetermined voltage level is required to be applied to said memory element in order to change data of said memory element;
a voltage converter circuit which receives a voltage from a power source via an external terminal as its power source voltage, and which forms an output voltage of a level different from that of said power source voltage, said output voltage being equal to or greater than the predetermined voltage level required to change the state of data stored in said memory element;
means for forming an internal control signal that changes from a first level to a second level when the data of said memory element is to be changed in response to an external control signal;
a power source closure detector circuit coupled to said power source and to said internal control signal forming circuit for forming an output signal which indicates a first condition when said power source is closed and which indicates a second condition when said internal control signal has said first level; and
a control circuit coupled to said power source closure detector circuit, said control circuit including means for preventing the output voltage of said voltage converter circuit from being applied to said memory element during a period in which said output signal indicates said first condition so that the data of said memory element is not changed by said output of said voltage converter circuit.

14. A semiconductor integrated circuit device according to claim 13, wherein said memory element includes a semiconductor nonvolatile memory element, and wherein said voltage converter circuit comprises a booster circuit for forming said output voltage, whereby said output voltage has a level greater than the level of said power source voltage.

15. A semiconductor integrated circuit device according to claim 14, wherein said internal control signal has said first level when the data of said memory element is to be read out.

16. A semiconductor integrated circuit device according to claim 15, wherein said power source closure detector circuit comprises a flip-flop circuit coupled to said external terminal and to said means for forming an internal control signal, and wherein said flip-flop circuit forms said output signal.

* * * * *